United States Patent [19]

Peck et al.

[11] Patent Number: 5,684,401

[45] Date of Patent: Nov. 4, 1997

[54] APPARATUS AND METHOD FOR COMPENSATION OF MAGNETIC SUSCEPTIBILITY VARIATION IN NMR MICROSPECTROSCOPY DETECTION MICROCOILS

[75] Inventors: Timothy L. Peck; Dean L. Olson, both of Champaign; Jonathan V. Sweedler, Urbana; Andrew G. Webb, Urbana; Richard L. Magin, Urbana, all of Ill.

[73] Assignee: Board of Trustees of the University of Illinois, Urbana, Ill.

[21] Appl. No.: 595,269

[22] Filed: Feb. 1, 1996

[51] Int. Cl.$^6$ .................................................. G01V 3/00
[52] U.S. Cl. ........................................ 324/318; 324/321
[58] Field of Search ...................................... 324/300, 307, 324/309, 312, 314, 306, 318, 321, 322

[56] References Cited

U.S. PATENT DOCUMENTS

| | | | |
|---|---|---|---|
| 5,394,088 | 2/1995 | Cory | 324/322 |
| 5,416,414 | 5/1995 | Mansfield et al. | 324/321 |

OTHER PUBLICATIONS

Bhagwandien, R. et al. "Numerical Analysis of the Magetic Field for Arbitrary Magnetic Susceptibility Distributions in 2D", *Magnetic Resonance Imaging*, Vol. 10, 1992, pp. 299–313.

Odeblad, Erik, "Miro–NMR in High Permanent Magnetic Fields", Acta Obstetricia et Gynecologica Scandinavica, vol. XLV, Supplement 2, 1966, pp. 84–119.

Albert, K., "On–Line Use of NMR Detection in Separation Chemistry", *Journal of Chromatography*, 703, 1995, pp. 123–147.

Apte, D.V. et al., "Phosphorus–31 NMR Spectroscopic Studies of Single Living Toad Retina", Abstracts, Society of Magnetic Resonance in Medicine, San Francisco, CA, Aug. 1988.

Black, R.D. et al., "A High–Temperature Superconducting Receiver for Nuclear Magnetic Resonance Microscopy", *Science*, Feb. 5, 1993, vol. 259, pp, 683–795.

Black, R.D. et al., "Performance of a High–Temperature Superconducting Resonator for High–Field Imaging", *Journal of Magnetic Resonance*, Series A 113, 1995, pp. 74–89.

Cho, Z.H. et al. "Nuclear Magnetic Resonance Microscopy with 4–μm resolution; Theoretical Study and Experimental Results", *Med. Phys.*, Nov./Dec. 1988, 15 (6), pp. 815–824.

Chu, Simon C.K. et al, "Bulk Magnetic Susceptibility Shifts in NMR Studies of Compartmentalized Samples: Use of Paramagnetic Reagents", *Magnetic Resonance in Medicine*, 1990, 13, pp. 239–262.

Fuks, L.F. et al., "Susceptibility, Lineshape, and Shimming in High–Resolution NMR", Journal of Magnetic Resonance, 100, 1992, pp. 229–242.

Lemarquard, G. et al., "Annular Magnetic Position Sensor." *IEEE Transactions on Magnetics*, vol. 26, No. 5. Sep. 1990.

(List continued on next page.)

*Primary Examiner*—Louis M. Arana
*Attorney, Agent, or Firm*—Woodard, Emhardt, Naughton Moriarty & McNett

[57] ABSTRACT

An apparatus and method for compensation of magnetic susceptibility variation in NMR microspectroscopy detection microcoils. NMR detection microcoils are formed with side-by-side windings in order to approximate a uniform cylindrical sheet coil. The wire may have a thin layer of insulation in order to prevent shorting between adjacent turns, or (if the wire diameter is small enough) uninsulated wire may be wound with the adjacent turns touching without fear of shorting between coil turns. Additionally, a susceptibility matching medium, such as a perfluorinated hydrocarbon, may be placed around the microcoil to minimize susceptibility-induced variations in the $B_0$ magnetic field.

15 Claims, 4 Drawing Sheets

OTHER PUBLICATIONS

Mahdjour, H. et al., "High–Sensitivity Broadband Microwave Spectroscopy with Small Nonresonant Coils", *Rev. Sci. Instrum.*, Jun. 1986, 57 (6), pp. 1100–1106.

McFarland et al., "Three–Dimensional NMR Microscopy: Improving SNR with Temperature and Microcoils", *Magnetic Resonance Imaging*, vol. 10, 1992, pp. 279–288.

Olson, D.L. et al., "High Resolution $^1$H–NMR for Nanoliter–Volume Samples", Abstracts, 22nd Annual Conference of the Federation of Analytical Chemistry and Spectroscopy Societies, Ohio, Oct. 1995, p. 155.

Olson, Dean L. et al., "High Resolution Microcoil $^1$H–NMR for Mass–Limited, Nanoliter–Volume Samples", *Science*, Dec. 22, 1995, vol. 270, pp. 1967–1970.

Peck, Timothy et al., "Design and Analysis of Microcoils for NMR Microscopy", *Journal of Magnetic Resonance*, Serier B 108, 1995, pp. 114–124.

Peck, T.L., "NMR Microscopy Coils", Abstracts, 3rd Annual Conference on Magnetic Resonance Microscopy, Würtzburg, Germany, Aug. 1995, p. 1.

Peck, T.L. et al., "NMR Microspectroscopy Using 100 µm Planar RF Coils Fabricated on Gallium Arsenide Substrates", *IEEE*, Jul. 1994, vol. 41, 706–709.

Peck, T.L. et al., "RF Microcoils with Micro–scale Feature Sizes for NMR Microscopy", *Abstracts, Twelfth Annual Scientific Meeting*, New York, NY, 1993, p. 296.

Peck, T.L. et al., "Planar Microcoils Sensors for NMR Microscopy", Abstracts, 2nd International Conference on Magnetic Resonance Microscopy, Heidelberg, 1993, p. 90.

Peck, T.L. et al., "RF Microcoils Patterned Using Microlithographic Techniques for Use as Microsensors in NMR", Abstracts, Proceedings of the Annual International Conference of the IEEE Engineering in Medicine and Biology Society, San Diego, CA, vol. 15, Oct. 1993, pp. 174–175.

Peck, T.L. et al., "Application of Planar Microcoils Fabricated on Glass Substrates to NMR Mircrospectroscopy", Abstracts, 17th Annual International Conference of the IEEE Engineering in Medicine and Biology Society, Montreal, Canada, Sep. 1995.

Rugar, D. et al., "Force Detection of Nuclear Magnetic Resonance", *Science*, Jun. 10, 1994, vol. 264, pp. 1560–1563.

Sanny, J. et al., "Microwave Electron Spin Resonance Spectrometer with Operation to 54 mK in a Dilution Refrigeration", *Rev. Sci. Instrum.*, Apr. 1981, 52 (4), pp. 539–541.

Sidles, J.A., "Noninductive Detection of Single–proton Magnetic Resonance", *Appl. Phys. Lett.*, Jun. 17, 1991, 58 (24), pp. 2854–2856.

Tippie, L.C. et al., "Low–temperature Magnetism of Quinolinium $(TCNQ)_2$, a Random–exchange Heisenberg Antiferromagnetic chain. 1. Static Properties", *Physical Review B*. Jun. 1, 1981, Vol. 23, No. 11, pp. 5846–5853.

Veeman, W.S. et al., "A New Way of NMR Detection & Force Detection", Abstracts, 3rd International Conference on Magnetic Resonance Microscopy, Würzburg, Germany, 1995, p. 7.

Webb, A.G. et al., "High Resolution NMR with Picomole Sensitivity", Abstracts, 3rd International Conference on Magnetic Resonance Microscopy, Würzburg, Germany, Aug. 1995, p. 59.

Wu, Nian et el., "$^1$H–NMR Spectroscopy on the Nanoliter Scale for Static and On–Line Measurements", *Analytical Chemistry*, vol. 66, No. 22, 1994, pp. 3849–3857.

Wu, Nian et al., "Nanoliter Volume Sample Cells for $^1$H NMR: Application to On–Line Detection in Capillary Electrophoresis", *Journal of the Amercan Chemical Society* vol. 116, No. 17, 1994, pp. 7929–7930.

Wu, Nian et al., "On–Line NMR Detection of Amino Acids and Peptides in Microbore LC", *Analytical Chemistry*, Sep. 15, 1995, vol. 67, No. 18, pp. 3101–3107.

Zelaya, F.O. et al., "Measurement and Compensation of Field Inhomogeneities Caused by Differences in Magnetic Susceptibility", *Journal of Magnetic Resonance*, Series A 115, 1995, pp. 131–136.

Zhou, X et al., "Magnetic Resonance Microscopy", *Annual Reports on NMR Spectroscopy*, vol. 31, 1995, pp. 48–54.

3M Product Literature, 3M Company.

(Coil diameter = 50 μm)

Capillary 130/75 (27.5 μm walls)
SNR=55.8/16=3.5   Linewidth (doublet)=24Hz

Capillary 350/250 (50 μm walls)
SNR=157.5/16=9.8   Linewidth=19.7Hz

Capillary 350/150 (100 μm walls)
SNR=100/16=6.25   Linewidth=8.4Hz

APPARATUS AND METHOD FOR COMPENSATION OF MAGNETIC SUSCEPTIBILITY VARIATION IN NMR MICROSPECTROSCOPY DETECTION MICROCOILS

TECHNICAL FIELD OF THE INVENTION

The present invention generally relates to nuclear magnetic resonance microspectroscopy and, more particularly, to an apparatus and method for compensation of magnetic susceptibility variation in NMR microspectroscopy detection coils.

BACKGROUND OF THE INVENTION

Analyzing a substance and detecting its components is critical in many areas of science, particularly biochemistry. In some applications, the substance to be analyzed or "analyte" is first separated into its components and then each component is analyzed to identify the component. The primary existing separation methods include liquid chromatography (LC), electrophoresis, capillary based liquid chromatography and capillary electrophoresis (CE). The main difference between the conventional and capillary techniques is separation efficiency. In other applications, an analyte is analyzed without separation, as this can provide additional information about the chemical structure of the analyte.

A variety of analysis (sample detection) techniques are available. Nuclear magnetic resonance (NMR) is a preferred detection modality for chemical analysis, as to the trained technician the information-rich NMR signal reveals much about the atomic and molecular structure of the substance. However, although the information content of the NMR signal is great, the NMR technique is inherently insensitive. Furthermore, recent trends in NMR detection, and chemical analysis in general, are toward smaller volumes and faster signal acquisition times. Each of these trends carry a substantial penalty in signal-to-noise ratio (SNR), primarily due to the cubic dependence of NMR signal strength (measured at the terminals of an appropriately designed RF receiver coil) on sample dimension and the reduced time over which signal averaging can occur. Consequently, the primarily limitation to NMR microscopy and microspectroscopy is a poor SNR.

To overcome the SNR limitation at reduced size scales, NMR researchers have utilized two methodologies for SNR enhancement: 1) the use of high-temperature superconductor technology to lower the resistance and experimental noise of the radiofrequency (RF) detection coil, thereby improving the experimental SNR, and 2) the reduction of RF coil size to small diameters (typically $d_{coil} < 1$ mm) using specially designed microcoils. However, each of these two approaches carry with them practical constraints that complicate their utilization. The use of superconducting materials for receiver coil construction, even at "high temperatures" of 70K–125K, requires a substantial degree of thermal insulation between the coil and the sample, and often precludes close geometrical placement of the sample and coil. This results in a lower filling factor for the coil, a received signal intensity of reduced magnitude, and a lower SNR. The use of highly sensitive microcoils provides intimate contact between the coil and the sample. However, the variation in magnetic susceptibility of the numerous materials that comprise the detection coil assembly (e.g., the coil, coil form, adhesive, etc.) lead to non-uniformities in the lines of magnetic flux of the superimposed static magnetic field (B0), and result in broadening of the NMR spectral linewidth, i.e., a decrease in spectral resolution and a potential loss of spectral information.

Although microcoils (RF coils having a diameter of less than approximately 1 mm) have been used since 1966 for NMR relaxation measurements, NMR and ESR microspectroscopy of solids, and NMR imaging studies, the application of microcoils to high resolution NMR microspectroscopy has not been demonstrated until recently. In the past, microcoils have been precluded from high resolution NMR microspectroscopy applications due to the inherently broad spectral linewidths that result from severe susceptibility-induced distortions in the static magnetic field ($B_0$) into which the sample is placed. High resolution NMR microspectroscopy typically requires $B_0$ uniformity to better than 10 parts-per-billion. For comparison, $B_0$ uniformity requirements for NMR imaging and NMR microspectroscopy of solids are typically on the order of parts-per-million, several orders of magnitude less stringent.

A primary cause of $B_0$ distortion in NMR is variation in magnetic susceptibility in both the materials that comprise the NMR detection coil assembly and in the sample itself. At larger sizes, were the sample is large compared with the feature size of the detection coil (i.e., compared to the diameter of the wire used to construct the coil) and where the sample is typically removed from the coil by at least several wire diameters, susceptibility variation within the sample (e.g. due to the presence of oxygen in a lung) is the dominant source of $B_0$ distortion. At smaller size scales, where the sample is in close proximity to the detection coil and where the feature sizes of the detection coil are comparable to the size of the sample, the most significant $B_0$ distortions arise from the differences in magnetic susceptibility of the materials (e.g., copper, plexiglass, etc.) from which the detection coil assembly is constructed and the air which typically surrounds the coil. This variation can be as much as several parts per million. The resulting non-uniformity in $B_0$ leads to linewidth broadening in the NMR spectrum. Although the theoretical limitation to both NMR microspectroscopy and microimaging is dictated by the SNR, the practical limitation to high resolution NMR microspectroscopy with microcoils has been poor spectral resolution.

Conventional (larger scale) NMR systems compensate for susceptibility-induced linewidth broadening by: 1) using specially designed materials (e.g., rhodinm coated copper wires) with a value of magnetic susceptibility that is matched to the value of the surrounding air, by 2) using alternative RF magnetic field ($B_1$) geometries (e.g., saddle coils and birdcage coils) that, although less sensitive than solenoidal designs, have a lesser effect on static field uniformity in the region of the sample, 3) by "spinning" the sample to spatially average localized variations in magnetic susceptibility, and by 4) "shimming" $B_0$ using a set of external shim coils. The shim coils generate a secondary static magnetic field of multiple order that when superimposed on $B_0$ compensates ("corrects") for the susceptibility-induced non-uniformities. However, at reduced size scales: 1) it is difficult to fabricate "same as air", susceptibility-matched materials, 2) the sample-size-squared reduction in SNR calls for the use of solenoids for optimal detection in this SNR-limited detection regime, 3) sample spinning is technically challenging at these dimensions, particularly when using solenoids, where the longitudinal axis of the sample is transverse to $B_0$, 4) the $B_0$ distortions are much more severe at smaller sizes, and are more difficult to compensate using traditional, bore-mounted shim coils, and 5) positioning of a submillimeter microcoil in the exact center of the shim field can be difficult. Positioning of the NMR detection coil in the center of the shim field is critical so that the sample is exposed to the proper orders and magnitudes of the individual shim field components and for measurement repeatability.

There is therefore a need in the prior art for an apparatus and method for compensation of magnetic susceptibility variation in NMR microspectroscopy detection coils in order to minimize the effects of magnetic susceptibility variation in the sensitive (sample) region of the microcoil. The present invention is directed toward meeting this need.

SUMMARY OF THE INVENTION

The present invention relates to an apparatus and method for compensation of magnetic susceptibility variation in NMR microspectroscopy detection microcoils. In one preferred geometry, a solenoidal NMR detection microcoil is formed with side-by-side windings in order to approximate a uniform cylindrical sheet coil. The wire may have a thin layer of insulation in order to prevent shorting between adjacent turns, or (if the wire diameter is small enough) uninsulated wire may be wound with the adjacent turns touching without fear of shorting between coil turns. Additionally, a susceptibility matching medium, such as a perfluorinated hydrocarbon, may be placed around the microcoil to minimize susceptibility-induced variations in the $B_0$ magnetic field.

In one form of the invention, a nuclear magnetic resonance microspectroscopy detection microcoil is disclosed, comprising a solenoid microcoil having a plurality of conductor turns and a longitudinal length of less than approximately 1 mm; wherein the plurality of conductor turns exhibit a side-by-side winding pattern such that adjacent conductor turns are in physical contact with one another.

In another form of the invention, a nuclear magnetic resonance microspectroscopy detection microcoil assembly is disclosed, comprising a microcoil having at least one conductor turn; and a susceptibility matching medium at least partially surrounding the at least one conductor turn; wherein a magnetic susceptibility of the susceptibility matching medium reduces distortions in a static magnetic field surrounding the microcoil.

In another form of the invention, a method for compensation of magnetic susceptibility variation in NMR microspectroscopy detection microcoils is disclosed, comprising the steps of: (a) forming a detection microcoil; and (b) at least partially surrounding the microcoil with a susceptibility matching medium, wherein a magnetic susceptibility of the susceptibility matching medium reduces distortions in a static magnetic field surrounding the microcoil.

In another form of the invention, a nuclear magnetic resonance microspectroscopy detection system is disclosed, comprising means for generating a static magnetic field; a detection microcoil positioned within the static magnetic field, the microcoil comprising a solenoid microcoil having a plurality of conductor turns and a longitudinal length of less than approximately 1 mm; wherein the plurality of conductor turns exhibit a side-by-side winding pattern; means for transmitting and receiving electrical signals to and from the microcoil; and control means for controlling the means for transmitting and receiving.

BRIEF DESCRIPTION OF THE DRAWINGS

FIG. 7b is a spectral plot showing the linewidth achieved using the capillary of FIG. 7a.

FIG. 8b is a spectral plot showing the linewidth achieved using the capillary of FIG. 8a.

FIG. 9b is a spectral plot showing the linewidth achieved using the capillary of FIG. 9a.

DETAILED DESCRIPTION OF THE PREFERRED EMBODIMENTS

Figure 1:
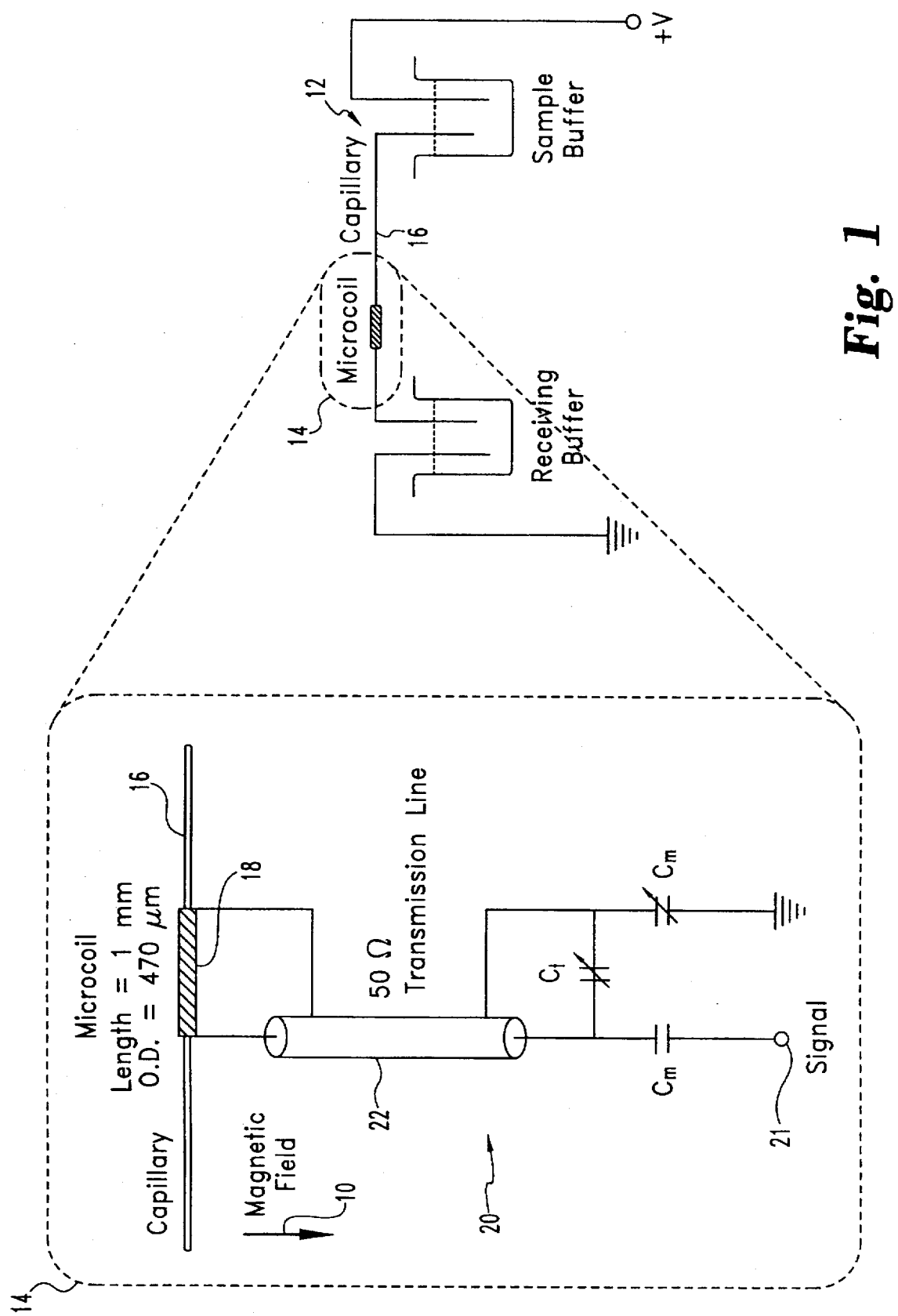
FIG. 1 is a schematic diagram of a microcoil based NMR detector circuit.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

FIG. 1 shows a microcoil based NMR detector circuit which can be used to detect analytes during capillary electrophoresis (CE). The CE application of the microcoil detector circuit in FIG. 1 illustrates only one of many possible applications (including both static NMR detection and NMR detection in other flowing and separation techniques, e.g. LC). In each distinct application, the electrical circuit containing the microcoil is substantially the same, but the external apparatii (e.g. the buffer solutions, separation instrumentation, etc.) differ. The region including the microcoil is expanded at the left of FIG. 1. The $B_0$ magnetic field of a nuclear magnetic resonance (NMR) spectrometer (not illustrated) is generally designated by the reference numeral 10 and the system for capillary electrophoresis (CE) is generally designated by the reference numeral 12. It is to be understood that the particular details of the magnetic field 10, the CE system 12 and the NMR spectrometer can vary so long as they function substantially as described herein. Positioned within the magnetic field 10 is an NMR probe generally designated by the reference numeral 14 for operable communication with the magnetic field 10 and the CE system 12. The probe 14 includes a capillary member 16 and an RF microcoil 18 which is in electrical communication with the matching circuit 20. The electrical signal appearing at output terminal 21 is applied to the NMR spectrometer. The physical configuration of the NMR probe 14 is discussed in greater detail hereinbelow.

In NMR microspectroscopy, the magnitude of the signal detected by the RF coil is directly proportional to the volume of the sample and to the sensitivity of the RF coil. Optimal signal detection is achieved when the size of the RF coil is tailored to provide maximum magnetic field coupling between the RF coil and the sample. Thus, microcoils can be used to provide an enhanced SNR when analyzing volume-limited samples over that which can be achieved using larger RF coils. The primary advantage of smaller coils for both static NMR detection and NMR detection in flowing systems is higher mass sensitivity due to the increase in coil detection sensitivity with decreasing coil size. The main challenge in designing a system for mass-limited and volume-limited NMR detection is the lack of sensitivity of the NMR technique which is resolved by the apparatus and method of the present invention.

In one embodiment, the capillary member 16 is formed from polyimide-coated fused silica with an inside diameter of between approximately 15 and 500 µm. In another embodiment, the capillary member may be formed using other magnetically advantageous (e.g., susceptibility matched) materials. The microcoil 18 preferably is wrapped about or lithographically fabricated on the exterior surface of the capillary member 16 to a longitudinal length of less than approximately 1 mm. Thus, the capillary member 16 serves as both the sample chamber and as the coil form. It is to be understood, however, that the material and dimensions of the capillary member 16 and the microcoil 18 can vary if desired. For example, the sample may be contained in the capillary member 16, or the capillary member may be formed into a substrate from glass or other suitable material, across which the analyte flows. The microcoil 18 then can be formed as a planar lithographic coil. Additionally, the capillary member 16 formed as a substrate can include one or more channels etched or grooved therein to serve as capillaries through which the analyte flows.

The microcoil 18 is preferably formed as a multi-turn solenoid and is wound or fabricated directly onto the capillary 16. Other geometries and winding configurations of the microcoil 18, however, can be used including, but not limited to, saddle coils, surface coils, birdcage coils, and coil arrays without departing from the scope of the present invention. The preferred embodiment construction of the microcoil 18 is described in greater detail hereinbelow.

In FIG. 1, the microcoil 18 is electrically connected to a semirigid coaxial cable 22 (such as that available from the Roseberger Micro-Coax Company of Collegeville, Pa., Part No. UT 85) by any conductive material, such as solder, conductive epoxy, silver paint or the like. The impedance matching elements ($C_t$ and $C_m$) that match the microcoil 18 impedance to the external coaxial cabling generally have a non-zero value of susceptibility and can lead to line broadening of the NMR spectrum. Therefore, in the embodiment illustrated in FIG. 1 the impedance matching elements are placed at the opposite end of the semi-rigid coaxial cable 22. The degradation in the electrical performance of the circuit that results from separation of the tank circuit elements (i.e. the coil and the impedance matching capacitors) is offset by the narrower line widths in the NMR spectrum. The microcoil 18 and the capillary 16 are mounted in a position such that the microcoil 18 is electrically (magnetically) perpendicular to the static $B_0$ magnetic field 10 over the detection region.

An NMR detection system preferably consists of several basic portions, as is known in the art. A static magnetic field generator (e.g. a permanent magnet, a superconducting magnet, an electromagnet, etc.) is used to establish the $B_0$ magnetic field 10. A detection microcoil (such as the microcoil of the present invention) is placed around or near the analyte and positioned within the $B_0$ magnetic field 10.

Transmit and receive signal processing circuitry is coupled to the detection microcoil in order to transmit the excitation signal and to receive the free induction decay (FID) signal. The transmit and receive circuitry is preferably under the control of a computer or other controller, through appropriate A/D and D/A interfaces.

Figure 2:
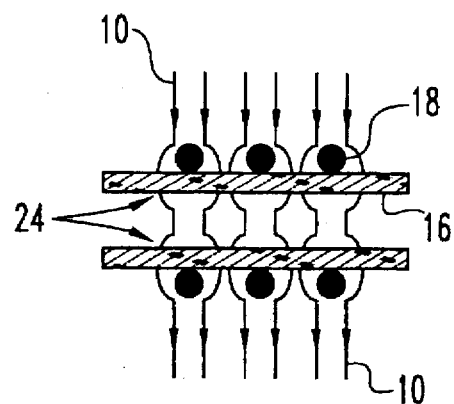
FIG. 2 is a cross-sectional view of a prior art microcoil wound on a capillary.

Referring now to FIG. 2, a magnified view of the microcoil 18 and capillary 16 are illustrated in a cross-sectional view. The magnetic flux lines for the $B_0$ magnetic field 10 are schematically illustrated in FIG. 2. It will be noted that there is a disturbance in the magnetic flux lines at regions such as 24 which arise from differences in magnetic susceptibility of the materials from which the detection probe 14 is constructed. For example, the microcoil 18, the air surrounding the coil and the capillary 16 all have different values of magnetic susceptibility. These differences cause perturbations 24 in the $B_0$ magnetic field 10. The resulting non-uniformity in $B_0$ leads to linewidth broadening in the measured NMR spectrum. The distortions 24 are a particular problem with RF microcoils, due to the fact that the measurement sample is located in proximity to the microcoil 18 that the areas of distortion 24 lie partially within the measured sample. The present invention is directed toward reducing such areas of distortion 24 within the measured sample.

Figure 3:
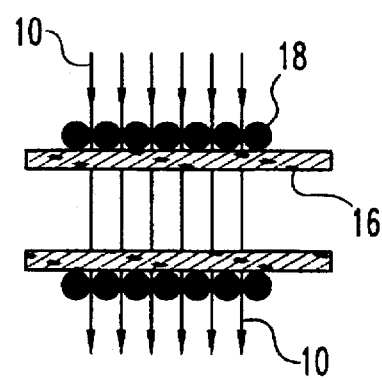
FIG. 3 is a cross-sectional view of a first embodiment microcoil of the present invention exhibiting side-by-side windings.

The present inventors have determined for the first time the important factors that influence microcoil performance. The traditional electric circuit models used to gauge coil behavior and understand detection performance of larger NMR detection coils are not directly applicable to microcoils. Furthermore, the traditional scaling laws and "rules of thumb" routinely used in the design of larger detection coils are not valid for microcoils. For example, it is well known in the prior art that an inter-turn spacing of 3 wire radii provides an optimum quality factor (and SNR) when constructing multi-turn solenoids at larger dimensions. However, at the smaller dimensions of a microcoil, this rule is not applicable. This is because the distribution of current in the windings of a microcoil is substantially different than that of larger NMR detection coils. At the smaller dimensions of the microcoil, the diameter of the wire approaches the skin depth of the current flowing through the wire. The result is that different physical rules come into play at the smaller dimensions of the microcoils. Electromagnetic field theory suggests that an infinitely long uniform hollow cylinder, when placed perpendicular to the lines of a uniform static magnetic field, will perturb the static magnetic field so that the static magnetic field within the cylinder remains essentially uniform (although the magnitude of the field can be diminished in accordance with the material properties of the cylinder). One embodiment of the present invention therefore attempts to significantly reduce susceptibility-induced distortions in $B_0$ by constructing or fabricating the solenoid coil using side-by-side winding of adjacent turns (i.e. nearly in contact or in contact). Such a side-by-side winding is illustrated in FIG. 3. The side-by-side winding approximates the geometry of a uniform cylindrical sheet coil. Consequently, when placed perpendicular to $B_0$, the static magnetic field inside the compactly wrapped or fabricated solenoidal microcoil remains relatively uniform. The use of a compact solenoid is uniquely suited to microcoil dimensions, where the proximity effect losses (assuming room-temperature copper wire) are relatively insignificant when compared to the intrinsic ohmic losses in the coil. The use of side-by-side winding of adjacent turns in the microcoil results in a reduction in NMR linewidth by over an order of magnitude when compared to experimental line width results obtained using prior art solenoidal geometries with spaced-turns. The advantage of the side-by-side winding microcoil of the present invention has not been realized in the prior art, presumably due to the expectation that this geometry would lead to a significant penalty in SNR at larger dimensions, and because these scaling laws were not sufficiently well understood to anticipate the different effects at smaller dimensions.

A first embodiment of the side-by-side winding of the microcoil 18 may be accomplished by utilizing wire having a very thin layer of insulation compared to the wire diameter. For example, 50 ga copper wire having an insulation thickness of several microns may be wound into a microcoil 18 with the adjacent turns touching, as shown in FIG. 3. Because of the relatively small insulation thickness, the turns of the side-by-side wound microcoil 18 approximate the electromagnetic characteristics of a uniform cylindrical sheet coil. In a second embodiment, an even better approximation of the uniform cylindrical sheet coil may be obtained by winding a microcoil 18 with adjacent turns touching as shown in FIG. 3, using uninsulated wire. The present inventors have discovered that if the wire diameter is less than approximately 20 μm, no (or very little) shorting occurs between adjacent turns and the structure exhibits the properties of a solenoidal microcoil. It is believed that this results from a surface property of the wire which has an insulating effect, such as the electrical resistance between adjacent touching turns being greater than the resistance of the wire, or possibly from a very thin layer of corrosion or oxidation on the surface of the wire (which is still considered to be "uninsulated" for the purposes of the present invention). It will be appreciated by those skilled in the art that the microcoils of the present invention may be formed by microlithography techniques in addition to physical winding techniques.

Figure 4:
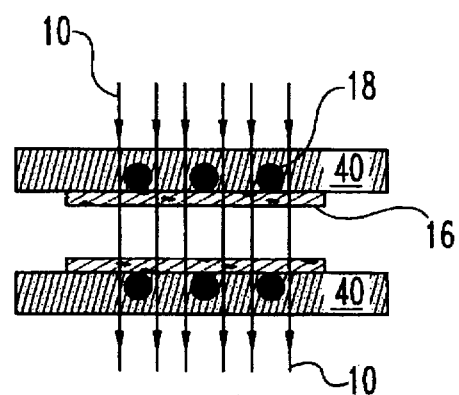
FIG. 4 is a cross-sectional view of a microcoil of the present invention wound around a capillary, in which a susceptibility matching surrounding medium fills the space between the windings of the microcoil.

A second technique of the present invention for reducing susceptibility-induced perturbations in the $B_0$ magnetic field 10 is to immerse the microcoil detector 14 in a surrounding medium (such as a fluid or solid compound) that is susceptibility matched to the wire used to construct the microcoil 18. For example, FIG. 4 illustrates the detector 14 of FIG. 2 with the addition of a fluid 40 surrounding the microcoil 18, where the susceptibility of the fluid 40 is matched to the susceptibility of the material used to construct the microcoil 18. In this manner, the space between the turns of the microcoil 18 is filled with a medium with a susceptibility value equal to that of the material used to construct the microcoil 18 (e.g. copper), rather than by air as is the case in FIG. 2. Oxygen, and air in general, are paramagnetic and consequently have values of susceptibility that are significantly different in magnitude and opposite in sign to that of copper, which is diamagnetic. The wire 18/fluid 40 matrix approximates a uniform cylinder, and in accordance with electromagnetic field theory provide reduced susceptibility-induced distortions within the $B_0$ magnetic field 10 and improved NMR spectral resolution. A comparison of the $B_0$ magnetic flux lines 10 of FIG. 2 and FIG. 4 illustrate the desirable effect that the fluid 40 has in reducing perturbations in the $B_0$ magnetic field 10. Although many different compounds could potentially be used for the fluid 40, a preferred embodiment of the fluid 40 for use with a copper microcoil 18 is a perfluorinated hydrocarbon (such as FLUORINERT FC-43, 3M Co., St. Paul, Minn.). There are currently 12 varieties of FLUORINERT in existence. FLUORINERT is ideally suited to the present application, as it is non-conducting (and consequently it does not electrically degrade, i.e. load, the detection coil 18), and it is not NMR-active (and consequently it does not contribute to the NMR signal).

A significant attribute of using a susceptibility-matched surrounding medium 40 of this type is that by mixing two compounds with values of susceptibility $\chi_a$ and $\chi_b$, it is possible to arrive at a mixture that has a net value of susceptibility that falls within the range $\delta\chi=\chi_a-\chi_b$, with the exact value dependent upon the mixing ratio. In this manner the susceptibility-matched surrounding medium can be easily tailored to accommodate a wide range of material types and susceptibility values. This concept can be extended to include the use of both paramagnetic and diamagnetic compounds, as well as mixtures of diamagnetic compounds to allow tuning of the bulk susceptibility to a desired value of $\chi$.

The idea of using a surrounding medium 40, either as the sole susceptibility-matching scheme, or to complement other susceptibility-matching schemes, at larger dimensions is often impractical, as the major source of susceptibility variation is usually the sample, not the coil. However, although complementary and potentially beneficial to other susceptibility-matching schemes at larger dimensions, the use of a surrounding medium 40 may sometimes be essential at microcoil dimensions. In this severely $B_0$-distorted size regime, many of the other techniques of susceptibility matching may not be possible, or if possible, may not provide the degree of accuracy in field correction that is achieved at larger dimensions. Consider, for example, the use of "same-as-air" susceptibility-matched wire. It is known in the prior art to use a rhodium-plated copper wire with "same as air" susceptibility. Typically, when considering larger coils, a 67 μm thick layer of rhodium is overlayed on a copper wire of 5 mm diameter for optimal results. Significant magnetic field distortions result when the thickness of the rhodium layer differs from the optimum value by greater than 10%. By geometrically scaling these results to microcoil dimensions (typical wire diameter≈50 μm), a sub-micron thick layer of rhodium, with a deposition thickness accuracy to within several hundred angstroms, is required. Although the manufacture of "same-as-air susceptibility" wire at these dimensions is theoretically feasible (using electroplating or microelectronic evaporation technology), there may be significant practical constraints to the fabrication and application of such wires. Nevertheless, the two techniques of susceptibility-matched wires and the use of a susceptibility-matched surrounding medium are complementary at microcoil dimensions.

The use of a susceptibility-matched surrounding medium may be particularly merited and practical when considering planar microlithographic microcoil designs, where non-copper conducting materials (e.g., gold, silver, aluminum) are often employed on a variety of substrates. In a non-cylindrical geometry, simply matching the susceptibility of the conductor to that of air will generally be insufficient, as the susceptibility of the substrate material will undoubtedly be an important contributor to the overall variation in $B_0$. In this case it may be necessary to susceptibility-match the conductive alloy to both the substrate and to the surrounding medium.

Figure 5:
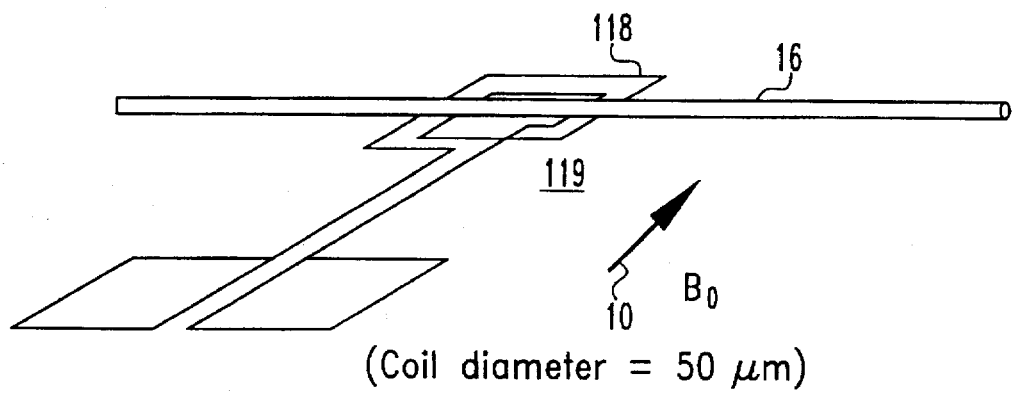
FIG. 5 is a perspective view of a planar microcoil of the present invention and an analyte sample capillary.
Figure 6:
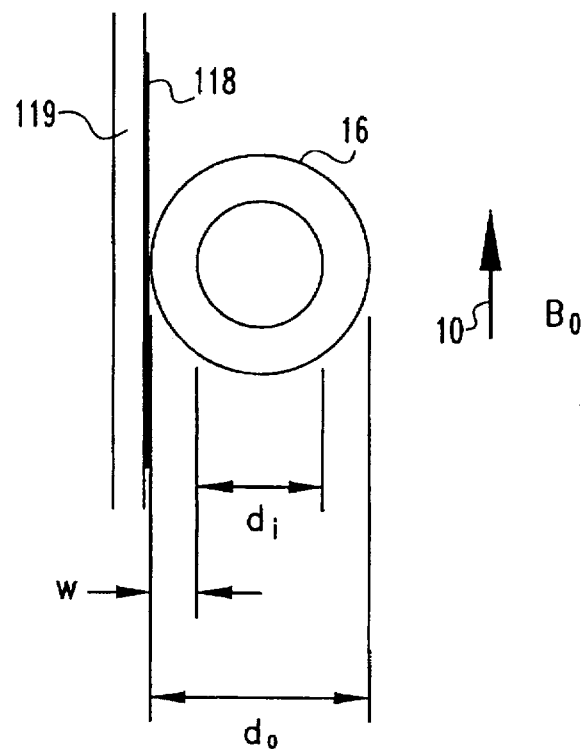
FIG. 6 is a cross-sectional view of the planar microcoil and capillary of FIG. 5.

For example, a planar microlithographic microcoil 118 is illustrated in FIG. 5. The planar microcoil 118 is formed upon a substrate 119 by techniques known in the art. In a preferred embodiment, planar microcoil 118 has a coil diameter of 50 μm. In the embodiment illustrated in FIG. 5, a capillary 16 containing the analyte preferably rests directly upon the microcoil 118 and substrate 119 and passes over the center of the planar microcoil 118. This is also illustrated in the cross-sectional view of FIG. 6. The $B_0$ magnetic field 10 is parallel to the substrate 119 and perpendicular to the capillary 16. The capillary 16 has an outside diameter $d_o$, an inside diameter $d_i$ and a wall thickness $w=d_o-d_i$. It will be appreciated by those skilled in the art that the analyte sample is separated from the planar microcoil 118 by the wall thickness w.

Figure 7A:
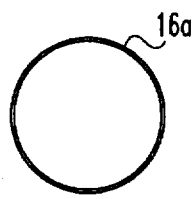
FIG. 7a is a cross-sectional view of a first capillary.
Figure 7B:
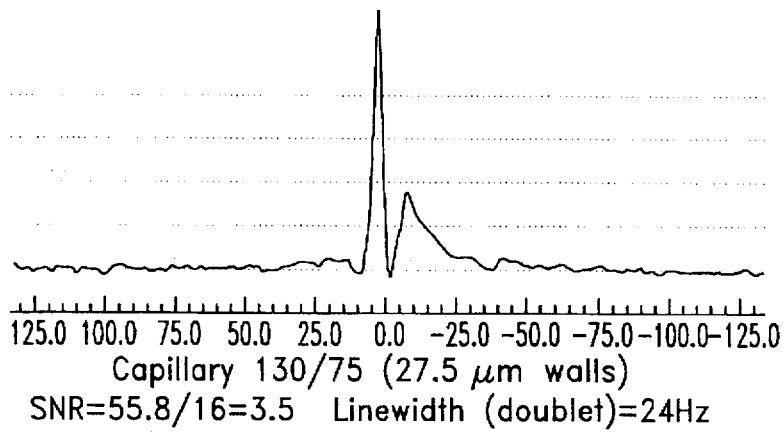
Figure 8A:
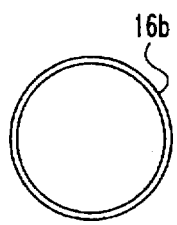
FIG. 8a is a cross-sectional view of a second capillary.
Figure 8B:
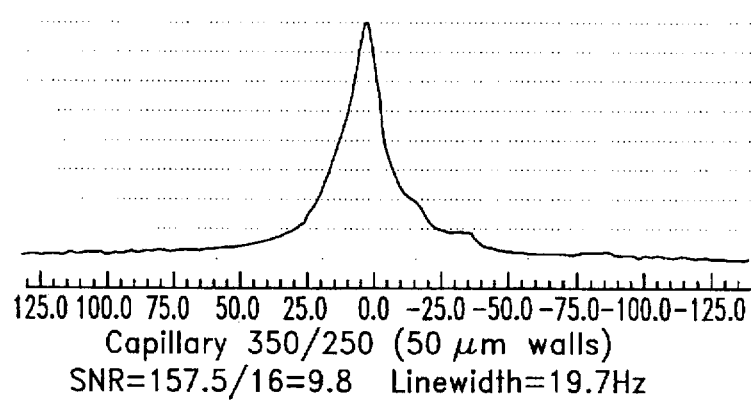
Figure 9A:
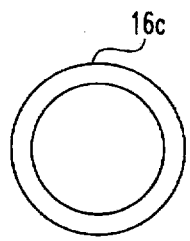
FIG. 9a is a cross-sectional view of a third capillary.
Figure 9B:
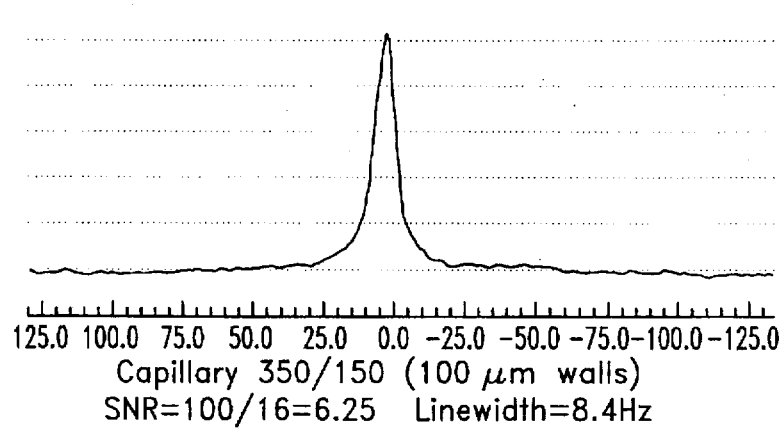

FIGS. 7b, 8b and 9b illustrate the results of NMR microspectroscopy of the same analyte (5 mM $CuSO_4$) using a planar microcoil (50 μm i.d., 4 μm feature size, 1.4 μm metalization thickness) as shown in FIG. 5. The microcoil 16a of FIG. 7a, having a wall thickness w=27.5 μm resulted in a measured linewidth (doublet) of 24 Hz, as shown in FIG. 7b. The microcoil 16b of FIG. 8a, having a wall thickness w=50 μm resulted in a measured linewidth of 19.7 Hz, as shown in FIG. 8b. Finally, the microcoil 16c of FIG. 9a, having a wall thickness w=100 μm resulted in a measured linewidth of 8.4 Hz. These experimental results illustrate that a substantial reduction in spectral linewidth may be achieved by removing the analyte sample from the sensitive region of the coil (e.g. by placing a thicker wall between the analyte and the planar microcoil 118). This is analogous to what is observed with solenoid coils and suggests that the planar microcoil 118 and substrate 119 are significant contributors to $B_0$ non-uniformity. Therefore, a susceptibility-matching medium with an appropriate value of magnetic susceptibility will provide improved performance and reduced spectral linewidth if used with planar microcoils and substrates.

Recent trends in NMR detection technology have been toward the use of lower resistance RF coils for decreased noise and increased SNR. These superconducting receiver coils have generally been in the size scale range of 1 cm diameter or greater. While advances in superconducting coil technology have provided a reduction in noise, and advances in microcoil technology have provided enhanced sensitivity for signal reception, the eventual combination of these two approaches will provide the optimal, high sensitivity, low noise, NMR detection coil. Consequently, cryogenic susceptibility matching mediums may be required to simultaneously cool the coil and provide a match in susceptibility for improved $B_0$ uniformity and spectral resolution. This approach is not limited to superconducting materials, but may also be used for coils made of traditional conductive materials (e.g. copper), cooled to reduce coil resistance and NMR noise. FLUORINERTs, such as FC-43 Z(with a pour point of $-50°$ C. and no recorded melting point) would be ideally suited to serve as susceptibility matching or surrounding fluids at reduced temperatures.

It should be noted that the mere presence of an appropriate surrounding medium 40 may help in reducing susceptibility-induced $B_0$ distortions by providing a deoxygenation of the region surrounding the microcoil. In NMR microspectroscopy, it has been shown that by removing the oxygen molecules (which are highly paramagnetic and are commonly known to lead to distortions of $B_0$) from the region of interest, a narrower linewidth is achieved. Consequently, it would be possible to achieve narrow NMR spectral linewidths using a surrounding fluid or compound 40 that is not ideally susceptibility matched to the wire of the coil, but rather one which is particularly good at removing oxygen. However, it is likely that both aspects of susceptibility homogeneity gained by using a surrounding medium fluid 40 (i.e., both deoxygenation and susceptibility match of the medium 40 to the wire of the coil) together provide optimal $B_0$ uniformity.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A nuclear magnetic resonance microspectroscopy detection microcoil assembly, comprising:

a microcoil having at least one conductor turn having a first magnetic susceptability; and a susceptibility matching medium at least partially surrounding the at least one conductor turn;

wherein a second magnetic susceptibility of the susceptibility matching medium substantially matches the first magnetic susceptability of the microcoil and thereby reduces distortions in a static magnetic field surrounding the microcoil.

2. The microcoil assembly of claim 1, wherein the susceptibility-matching medium is cooled to provide a lower-than-ambient temperature for the microcoil.

3. The microcoil assembly of claim 1, wherein the susceptibility matching medium is a liquid.

4. The microcoil assembly of claim 3, wherein the susceptibility matching medium is a perfluorinated hydrocarbon.

5. The microcoil assembly of claim 4, wherein the perfluorinated hydrocarbon is FLUORINERT FC-43.

6. The microcoil assembly of claim 3, wherein the susceptibility-matching medium is a cryogenic coolant.

7. The microcoil assembly of claim 1, wherein the microcoil is solenoidal.

8. The microcoil assembly of claim 7, wherein the at least one conductor turn is formed on a capillary tube.

9. The microcoil assembly of claim 1, wherein the microcoil is planar.

10. The microcoil assembly of claim 9, wherein the at least one conductor turn is formed on a substrate.

11. The microcoil assembly of claim 1, wherein the susceptibility matching medium is a mixture of at least two compounds.

12. The microcoil assembly of claim 11, wherein one of the compounds is paramagnetic and another of the compounds is diamagnetic.

13. A method for compensation of magnetic susceptibility variation in NMR microspectroscopy detection microcoils, comprising the steps of:

(a) forming a detection microcoil having a first magnetic susceptability; and (b) at least partially surrounding the microcoil with a susceptibility matching medium, wherein a second magnetic susceptibility of the susceptibility matching medium substantially matches the first magnetic susceptability of the microcoil and thereby reduces distortions in a static magnetic field surrounding the microcoil.

14. The method of claim 13, wherein the susceptibility matching medium is a perfluorinated hydrocarbon.

15. A nuclear magnetic resonance microspectroscopy detection system, comprising:

means for generating a static magnetic field;

a detection microcoil positioned within the static magnetic field, the microcoil comprising:
   a microcoil having a first magnetic susceptability
   a susceptibility matching medium at least partially surrounding the microcoil;

wherein a second magnetic susceptibility of the susceptibility matching medium substantially matches the first magnetic susceptability of the microcoil and thereby reduces distortions in a static magnetic field surrounding the microcoil;

means for transmitting and receiving electrical signals to and from the microcoil; and control means for controlling the means for transmitting and receiving.

* * * * *